United States Patent
Kawabata et al.

(10) Patent No.: US 10,638,605 B2
(45) Date of Patent: Apr. 28, 2020

(54) PRINTED CIRCUIT BOARD STRUCTURE

(71) Applicant: DENSO TEN LIMITED, Kobe-shi, Hyogo (JP)

(72) Inventors: Tamaki Kawabata, Kobe (JP); Kenichi Osakabe, Kobe (JP)

(73) Assignee: DENSO TEN Limited, Kobe (JP)

( * ) Notice: Subject to any disclaimer, the term of this patent is extended or adjusted under 35 U.S.C. 154(b) by 0 days.

(21) Appl. No.: 16/042,489

(22) Filed: Jul. 23, 2018

(65) Prior Publication Data
US 2018/0332705 A1    Nov. 15, 2018

Related U.S. Application Data

(63) Continuation of application No. 15/650,292, filed on Jul. 14, 2017, now abandoned.

(30) Foreign Application Priority Data

Jul. 28, 2016  (JP) ................................. 2016-149058

(51) Int. Cl.
*G06F 17/50*  (2006.01)
*H05K 1/11*  (2006.01)
(Continued)

(52) U.S. Cl.
CPC ........... *H05K 1/115* (2013.01); *H05K 1/0209* (2013.01); *H05K 1/0296* (2013.01);
(Continued)

(58) Field of Classification Search
USPC .................. 716/137, 138, 110, 111
See application file for complete search history.

(56) References Cited

U.S. PATENT DOCUMENTS

| | | | | |
|---|---|---|---|---|
| 6,483,714 B1* | 11/2002 | Kabumoto | ........ | H01L 23/49822 174/250 |
| 2003/0099097 A1* | 5/2003 | Mok | .................. | G01R 1/06716 361/767 |
| 2010/0200276 A1* | 8/2010 | Karikalan | ............ | H05K 1/0245 174/250 |

FOREIGN PATENT DOCUMENTS

DE   10 2007 041 770 A1   3/2009
EP      2 034 807 B1      3/2009
(Continued)

OTHER PUBLICATIONS

First Notification of Office Action issued by the China National Intellectual Property Administration for corresponding Chinese Patent Application No. 201710627094.9, dated Apr. 10, 2019, with an English translation.

(Continued)

*Primary Examiner* — Brian Ngo
(74) *Attorney, Agent, or Firm* — Myers Wolin, LLC

(57) ABSTRACT

A circuit board design device judging whether a circuit board has a pair of via holes which are adjacent within a solder bridge formation distance within which a solder bridge can be formed; when the affirmative, the circuit board design device judging whether each of the pair of via holes is electrically connected in parallel to other via hole with a land not coated with solder resist; when the circuit board design device judges that at least one of the pair of via holes is electrically connected in parallel to the other via hole with a land not coated with solder resist, the circuit board design device determining the at least one of the pair of via holes which is electrically connected in parallel to the other via hole with a land not coated with solder resist as a coated via hole with a land coated with solder resist.

6 Claims, 10 Drawing Sheets

(51) Int. Cl.
H05K 3/00 (2006.01)
H05K 3/42 (2006.01)
H05K 1/02 (2006.01)

(52) U.S. Cl.
CPC ......... *H05K 3/0088* (2013.01); *H05K 3/0094* (2013.01); *H05K 3/42* (2013.01); *H05K 2201/094* (2013.01); *H05K 2201/0979* (2013.01); *H05K 2203/044* (2013.01)

(56) References Cited

FOREIGN PATENT DOCUMENTS

| JP | 11154778 | * 11/1997 | ............... H05K 1/11 |
| JP | 11-154778 A | 6/1999 | |
| JP | H11-154778 A | 6/1999 | |

OTHER PUBLICATIONS

Non-Final Office Action issued by the United States Patent and Trademark Office for corresponding U.S. Appl. No. 15/650,292, dated Dec. 11, 2017.

Final Office Action issued by the United States Patent and Trademark Office for corresponding U.S. Appl. No. 15/650,292, dated May 2, 2018.

Office Action issued by the German Patent Office for corresponding German Patent Application No. 10 2017 211 986.1, dated Jan. 16, 2020, with a partial English translation.

* cited by examiner

PRINTED CIRCUIT BOARD STRUCTURE

CROSS REFERENCE TO RELATED APPLICATIONS

This application is a continuation application of U.S. patent application Ser. No. 15/650,292, filed on Jul. 14, 2017, which claims the benefit of JP 2016-149058, filed on Jul. 28, 2016. The entire content of each is hereby incorporated by reference.

FIELD

The present invention relates to a printed circuit board structure.

BACKGROUND

It is known to provide conduction among electrically conductive layers of a printed circuit board by forming a through-hole with an electrically conductive sidewall, which is called a via hole, on the printed circuit board. The space between via holes formed on a printed circuit board has been narrowed by reducing the size of electronic equipment, and, in some cases, a solder bridge is formed between the lands (portions of the electrically conductive material of the via holes exposed in a doughnut shape on the surface of the printed circuit board) of adjacent via holes during soldering. In addition, particularly in the vicinity of a portion of the printed circuit board where the heat capacity is large, in some cases, a solder ball is formed on the land of a via hole during soldering. When the solder bridge or the solder ball is separated and moved away from the printed circuit board due to some sort of shock or the like and short-circuits the wiring of the printed circuit board or the lead wires of components after the printed circuit board is incorporated into electronic equipment, the electronic equipment may malfunction. It is known to prevent the formation of the solder bridge or the solder ball by applying solder resist on the lands of all via holes that are not used for mounting of a component such that the solder does not adhere to the lands of the via holes during soldering (see, for example, Patent Document 1).

Related Documents

[Patent Document 1] Japanese Laid Open Patent Document No. H11-154778

SUMMARY

When, however, the solder resist is applied on the land of the via hole, in some cases, the solder resist blocks the opening of the via hole or, even if it does not block the opening, so-called dripping caused by the solder resist flowing into the through hole of the via hole occurs. When the via hole is blocked or the dripping occurs inside, there is a possibility that an etching solvent or the like used in a printed circuit board manufacturing process is not fully rinsed off, but remains within the via hole, and the via hole is disconnected when the residue of the remaining etching solvent or the like reacts with the electrically conductive material that covers the side surface of the via hole. The disconnection of the via hole interferes with the conduction between the layers of the printed circuit board and the electronic equipment may be eventually malfunction.

The printed circuit board structure according to an embodiment solves the aforementioned problem, and it is an object to provide a printed circuit board structure in which there is little possibility that a solder bridge or a solder ball is formed and there is little possibility that malfunction of the electronic equipment due to disconnection of a via hole is generated.

In order to realize the aforementioned object, a printed circuit board structure according to the embodiment is formed with via holes for electrically conductively connecting electrically conductive layers of a printed circuit board, wherein the via holes include a coated via hole with a land coated with solder resist and a non-coated via hole with a land not coated with solder resist, the coated via hole is arranged in a place of the printed circuit board where it is highly probable that the solder bridge or the solder ball is generated, and is electrically connected to at least one non-coated via hole in parallel.

In addition, regarding the printed circuit board structure according to the embodiment, it is preferable that the coated via hole is arranged in a place where a distance between adjacent via holes is equal to or less than a predetermined distance, one of the adjacent via holes being the coated via hole and the other being the non-coated via hole.

In addition, regarding the printed circuit board structure according to the embodiment, it is preferable that the coated via hole is arranged in a place where a distance from a metal member arranged on the printed circuit board is equal to or less than a predetermined distance.

In addition, regarding the printed circuit board structure according to the embodiment, it is preferable to include a first region where an electronic component is soldered by a flow process or a dip process and a second region protected from solder by a masking jig when soldering is performed in the first region, wherein the coated via hole is preferably arranged in a place within the first region where a distance from a boundary with the second region is equal to or less than a predetermined distance.

In addition, regarding the printed circuit board structure according to the embodiment, it is preferable that the coated via hole is arranged on a power supply voltage pattern unit of the printed circuit board to which a power supply voltage is fed.

In addition, regarding the structure of a printed circuit board according to the embodiment, it is preferable that the coated via hole is connected to a ground pattern unit of the printed circuit board to be grounded.

With the structure of the printed circuit board according to the embodiment, it is possible to reduce the possibility that the solder bridge or the solder ball is formed, and it is possible to reduce the possibility that malfunction of the electronic equipment due to disconnection of a via hole is generated.

DESCRIPTION OF EMBODIMENTS

A printed circuit board structure according to embodiments is described with reference to the drawings below. It should be noted, however, that the technical scope of the present invention is not limited to the embodiments, but covers equivalents of the invention stated in the claims. Regarding the printed circuit board structure according to the embodiments, the via holes include a non-coated via hole with the land not coated with solder resist and a coated via hole with the land coated with solder resist. A via hole the distance from which to an adjacent non-coated via hole is equal to or less than the distance of the formation of the solder bridge is selectively adopted as a coated via hole so as to minimize the number of coated via holes and minimize the possibility of the generation of disconnection of the via hole.

(Printed Circuit Board Structure According to the First Embodiment)

Figure 1A:
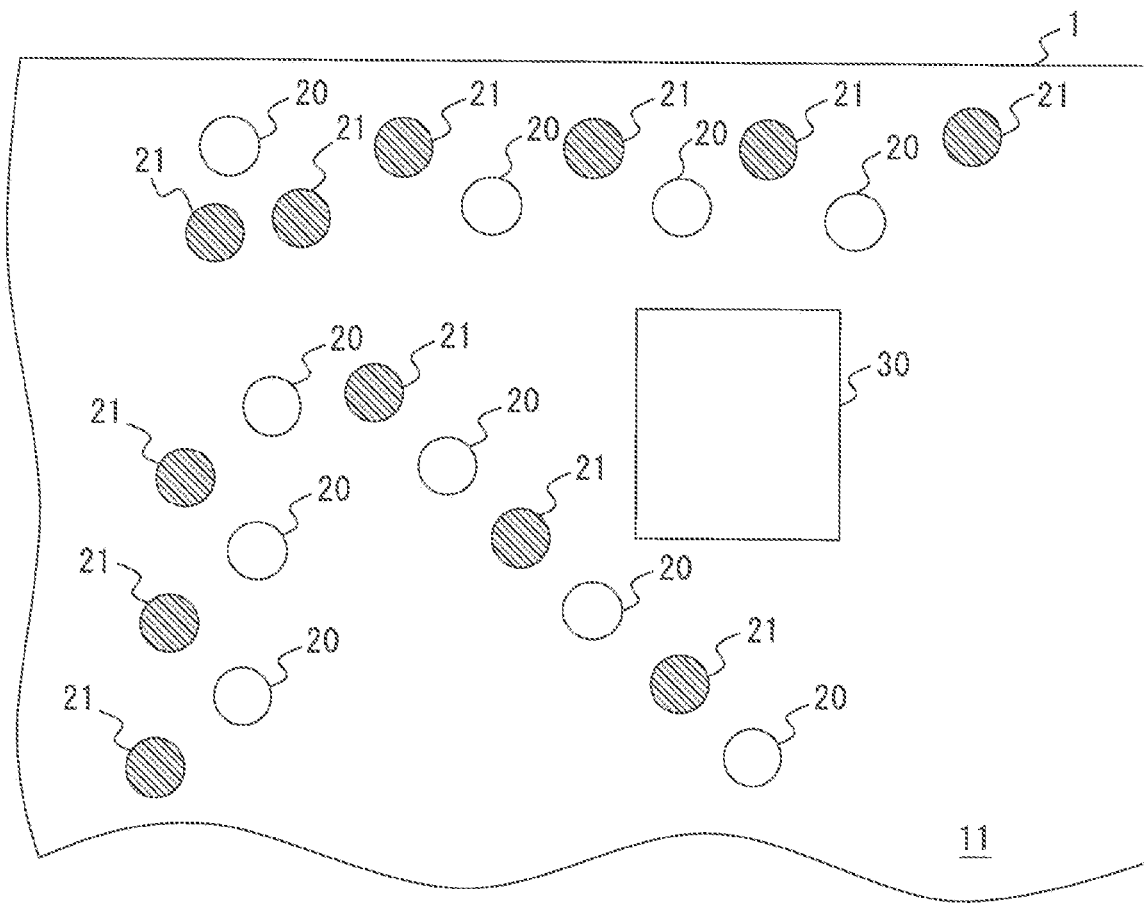
FIG. 1A is a partial plan view of a printed circuit board according to a first embodiment.
Figure 1B:
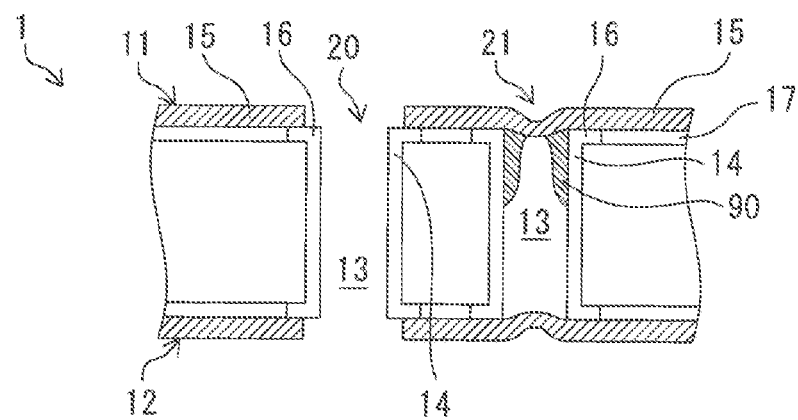
FIG. 1B is a partial cross-sectional view of the printed circuit board illustrated in FIG. 1A.

FIG. 1A is a partial plan view of a printed circuit board according to the first embodiment, and FIG. 1B is a partial cross-sectional view of the printed circuit board illustrated in FIG. 1A.

A printed circuit board 1 includes a first surface 11 and a second surface 12 positioned opposite the first surface 11, and is formed with via holes 20 and 21 in which the wall surfaces of through-holes 13 extending from the first surface 11 to the second surface 12 are covered with an electrically conductive material 14, e.g., copper. In addition, in portions where the via hole is exposed on the first surface 11 and the second surface 12 of the printed circuit board 1, a land 16 where the electrically conductive material 14 surrounds the circumference of the opening of the via hole in a doughnut shape is formed. An electronic component 30 is soldered on the first surface 11 or the second surface 12 of the printed circuit board 1 with solder. Solder resist 15 is applied on both the first surface 11 and the second surface 12 of the printed circuit board 1. Regarding the printed circuit board 1, a non-coated via hole and an electronic component, e.g., the electronic component 30, are soldered by the flow process or the dip process. Herein, the flow process indicates a soldering process in which solder stored in a solder bath is jetted and the surface of the circuit board is washed by the jet, and the dip process indicates a soldering process in which a printed circuit board is dipped in solder stored in a solder bath.

The via holes 20-21 include the non-coated via holes 20 with the lands 16 not coated with the solder resist 15 and the coated via holes 21 with the lands 16 coated with the solder resist 15. A residue 90, e.g., of an etching solvent, can remain in the coated via hole 21.

Figure 2A:
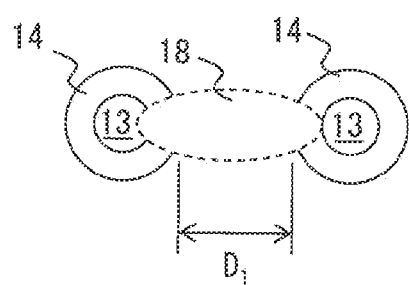
FIG. 2A is a first view for explaining a distance between a non-coated via hole and a coated via hole illustrated in FIGS. 1A and 1B.
Figure 2B:
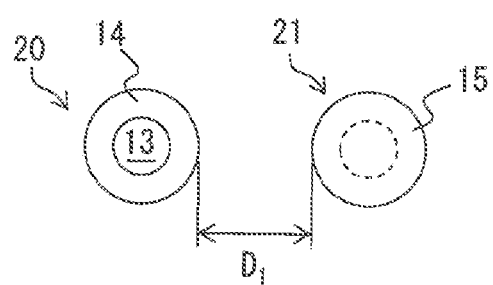
FIG. 2B is a second view for explaining a distance between a non-coated via hole and a coated via hole illustrated in FIGS. 1A and 1B.

FIG. 2A is a first view for explaining a distance between the non-coated via hole 20 and the coated via hole 21, and FIG. 2B is a second view for explaining a distance between the non-coated via hole 20 and the coated via hole 21.

Regarding the printed circuit board 1, a distance between the coated via hole 21 and the non-coated via hole 20 adjacent to the coated via hole 21 is equal to or less than a solder bridge formation distance $D_1$ where the solder for soldering the electronic component 30 forms a solder bridge 18. In other words, when a distance with respect to an adjacent non-coated via hole 20 is equal to or less than the solder bridge formation distance $D_1$, such a via hole is selected as the coated via hole 21. Specifically, when a space between adjacent via holes is equal to or less than $D_1$, one of the via holes is selected as the non-coated via hole 20 and the other is selected as the coated via hole 21. In one example, a via hole the distance from which with respect to an adjacent non-coated via hole 20 is 0.75 mm or less is selected as the coated via hole 21. When one of adjacent via holes is selected as the coated via hole 21, the solder is not adhered to the land of the via hole 21, so that the formation of the solder bridge with respect to the land of the non-coated via hole 20 can be prevented.

Furthermore, the coated via hole 21 is electrically connected to any of the non-coated via holes 20 in parallel. Even if the via hole is disconnected by an etching solvent or the like remaining in the through-hole of the coated via hole 21, the non-coated via hole 20 connected in parallel maintains the electrical connection, thereby reducing the possibility of malfunction of the electronic equipment.

More preferably, the non-coated via hole 20 and the coated via hole 21 are provided on a pattern unit that constitutes a power supply feed line VDD of the printed circuit board or a pattern unit that constitutes a ground line VSS of the printed circuit board. The pattern units constituting the power supply feed line VDD or the ground line VSS is often grounded with a large number of via holes being electrically connected in parallel in order to reduce impedance or ensure more current capacity. In such a portion, even if one or a few coated via holes 21 are disconnected, the electrical connection is maintained by another large number of non-coated via holes 20 or the coated via holes 21, which are not disconnected, thereby reducing the possibility of malfunction of the electronic equipment.

Figure 3:
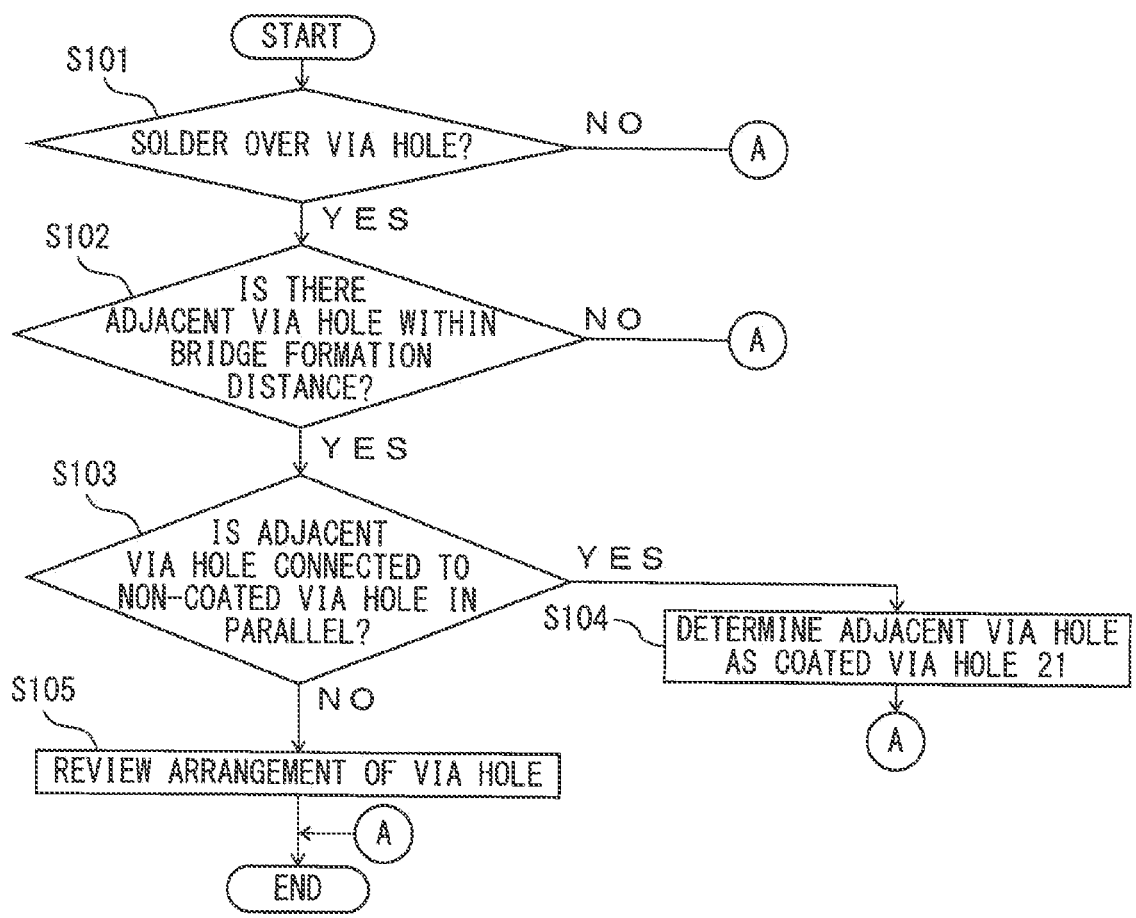
FIG. 3 is a flow chart indicating a coated via hole determination processing for determining the coated via hole illustrated in FIGS. 1A and 1B.

FIG. 3 is a flow chart indicating coated via hole determination processing for determining the coated via hole 21. The processing illustrated in FIG. 3 is executed on each via hole formed on a printed circuit board by a circuit board design device (e.g., a printed circuit board design CAD system), which is not illustrated.

First, the circuit board design device judges whether there is a possibility that soldering is performed by the flow process or the dip process on a via hole formed on a printed circuit board (S101). When the circuit board design device judges that there is no possibility that soldering is performed by the flow process or the dip process on the via hole formed on the printed circuit board (S101—NO), the processing is completed.

When the circuit board design device judges that there is a possibility that the soldering is performed on the via hole (S101—YES), the circuit board design device judges whether there is an adjacent via hole within the solder bridge formation distance $D_1$ where the solder bridge can be formed from the via hole on which the soldering is performed (S102). When the circuit board design device judges that there is no adjacent via hole within the solder bridge formation distance $D_1$ from the via hole on which the soldering is performed (S102—NO), the processing is completed.

When the circuit board design device judges that there is an adjacent via hole within the solder bridge formation distance $D_1$ (S102—YES), the circuit board design device judges whether the adjacent via hole within the solder bridge formation distance $D_1$ is electrically connected to the non-coated via hole 20 in parallel (S103). When the circuit board design device judges that the adjacent via hole within the solder bridge formation distance $D_1$ is electrically connected in parallel to the non-coated via hole 20 (S103—YES), the circuit board design device determines the adjacent via hole as the coated via hole (S104).

When the circuit board design device judges that the adjacent via hole within the solder bridge formation distance $D_1$ is not electrically connected to the non-coated via hole 20 in parallel (S103—NO), the circuit board design device reviews the arrangement of the via hole (S105). In one example, the circuit board design device arranges the via hole, which has been judged to be not connected to the non-coated via hole 20 in parallel, apart from the non-coated via hole 20 by a distance larger than the solder bridge formation distance $D_1$.

(Printed Circuit Board Structure According to the Second Embodiment)

Figure 4:
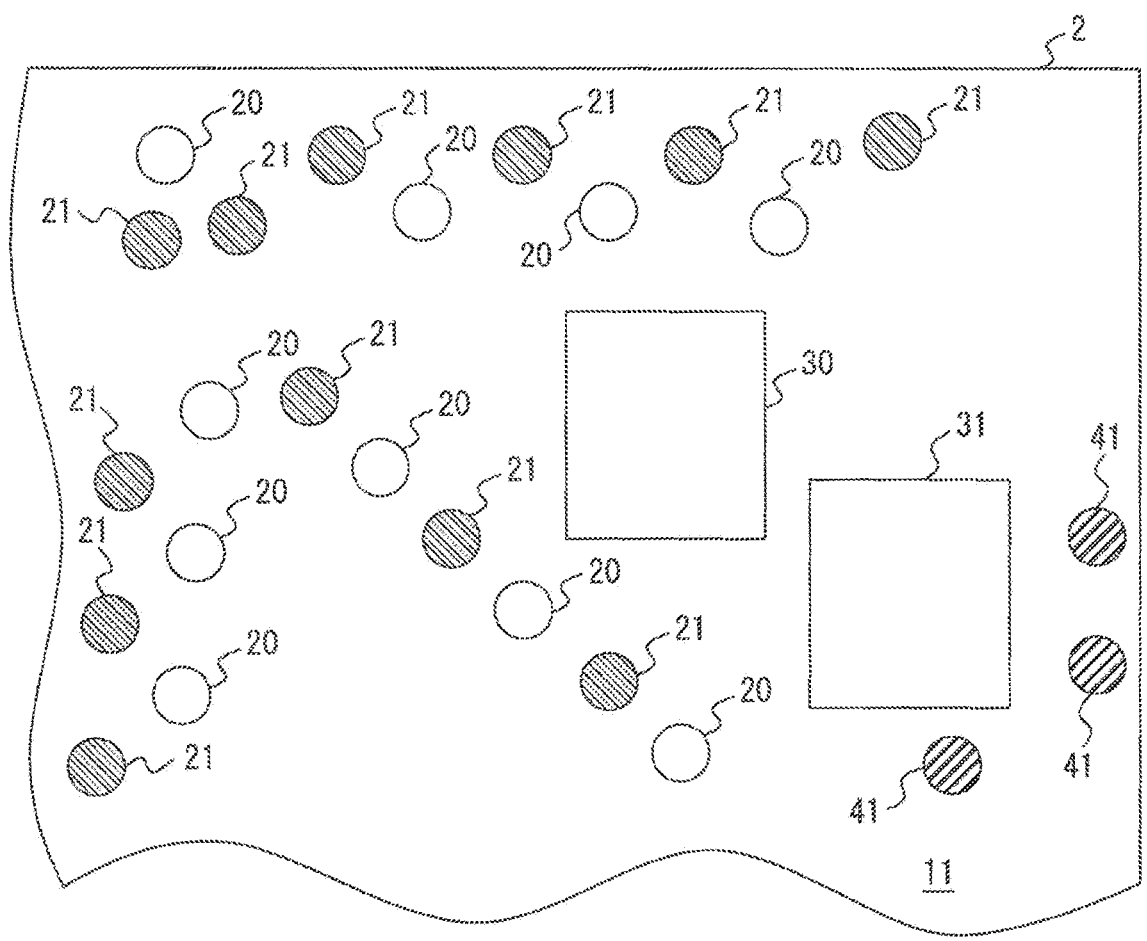
FIG. 4 is a partial plan view of a printed circuit board according to a second embodiment.

FIG. 4 is a partial plan view of a printed circuit board according to the second embodiment.

A printed circuit board 2 differs from the printed circuit board 1 in that a metal member 31 is arranged in addition to the electronic component 30. In addition, the printed circuit board 2 differs from the printed circuit board 1 in that via holes 41 are formed in addition to the via holes 20-21. Constituent elements of the printed circuit board 2 other than the metal member 31 and the via holes 41 are the same as the constituent elements of the printed circuit board 1, which are designated with the same reference numerals, and their detailed descriptions are omitted.

In one example, the metal member 31 is a heat dissipation fin or a shielding case for electrically shielding a component on the printed circuit board 2, and is soldered on the first surface 11 of the printed circuit board 2 by the flow process or the dip process together with the electronic component 30. In addition, the metal member 31 may be preliminarily arranged on the printed circuit board 2 independently of the electronic component 30 in a different process.

Figure 5A:
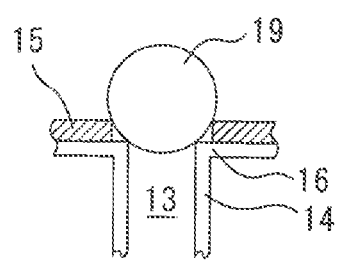
FIG. 5A is an explanatory view in which a solder ball is formed on the land of a via hole.
Figure 5B:
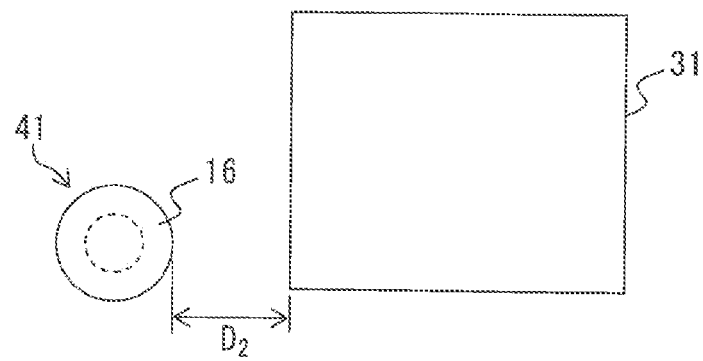
FIG. 5B is a view for explaining a distance between a non-coated via hole and a coated via hole illustrated in FIG. 4.

FIG. 5A is an explanatory view in which a solder ball is formed on the land of a via hole, and FIG. 5B is a view for explaining a distance between the metal member 31 and the coated via hole 41.

Regarding the printed circuit board 2, a distance between the metal member 31 and the coated via hole 41 is equal to or less than a solder ball formation distance $D_2$ where the solder forms a solder ball 19 on the land of a via hole. In other words, when a distance between the metal member 31 and the coated via hole 41 is equal to or less than the solder ball formation distance $D_2$, the via hole is selected as the coated via hole 41. In one example, when a distance with the metal member 31 is 1.5 mm or less, the via hole is selected as the coated via hole 41. Because the metal member 31 has a large heat capacity, there is a possibility that, when the electronic component 30 or the like is soldered by the flow process or the dip process, the temperature of the land of a via hole the distance from which to the metal member 31 is equal to or less than the solder ball formation distance $D_2$ is not sufficiently increased, so that the solder is not well spread on the land and the solder ball is formed. When the solder resist is applied to a via hole the distance from which to the metal member 31 is equal to or less than the solder ball formation distance $D_2$, the solder ball can be prevented from being formed on the land of the via hole the distance from which to the metal member 31 is equal to or less than the solder ball formation distance $D_2$.

Furthermore, as with the first embodiment, the coated via hole 41 is electrically connected to any of the non-coated via holes 20 in parallel, even if the via hole is disconnected by an etching solvent or the like remaining in the through-hole of the coated via hole 41, the non-coated via hole 20 connected in parallel maintains the electrical connection, thereby reducing the possibility of malfunction of the electronic equipment, and more preferably, the non-coated via hole 20 and the coated via hole 41 are provided on a pattern unit constituting the power supply feed line VDD of the printed circuit board and on a pattern unit constituting the ground line VSS of the printed circuit board.

Figure 6:
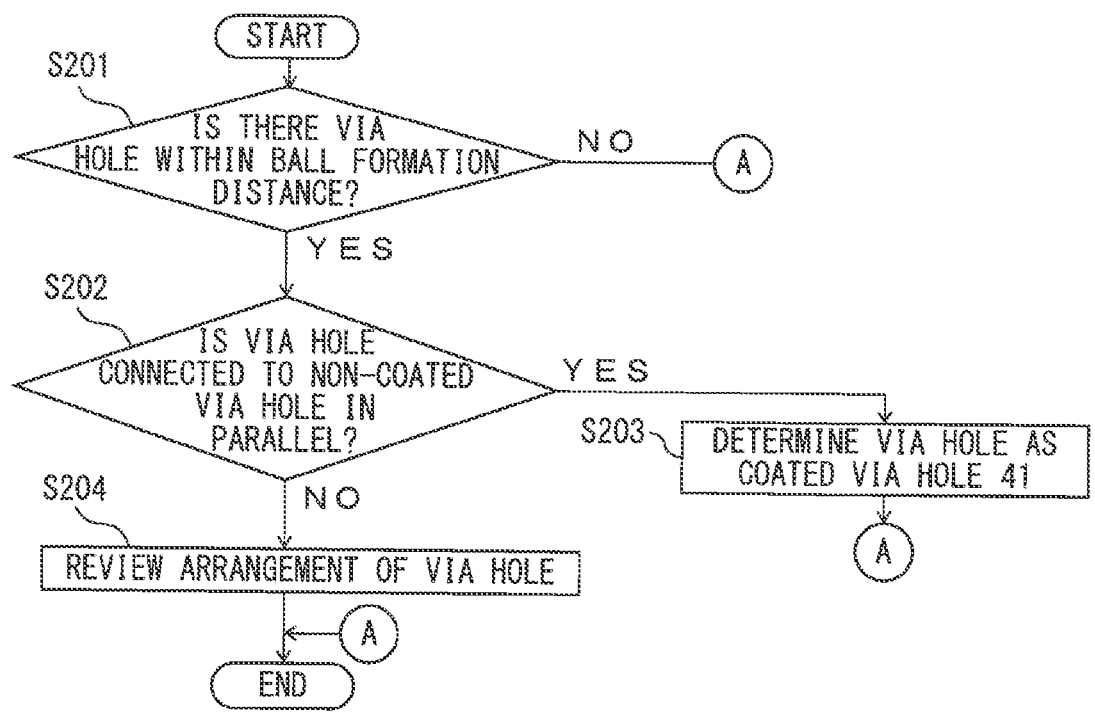
FIG. 6 is a flow chart indicating a coated via hole determination processing for determining the coated via hole illustrated in FIG. 4.

FIG. 6 is a flow chart indicating coated via hole determination processing for determining the coated via hole 41. The processing illustrated in FIG. 6 is executed for each via hole formed on a printed circuit board by a circuit board design device, which is not illustrated. In addition, the processing of FIG. 6 may be performed continuously to the processing indicated in FIG. 3 by the circuit board design device of the first embodiment.

First, the circuit board design device judges whether there is a via hole the distance from which to the metal member 31 is equal to or less than the solder ball formation distance $D_2$ where the solder ball can be formed when the soldering is performed with the solder by the flow process or the dip process (S201). When the circuit board design device judges that there is no via hole the distance from which to the metal member 31 is equal to or less than the solder ball formation distance $D_2$ (S201—NO), the processing is completed.

When the circuit board design device judges that there is a via hole the distance from which to the metal member 31 is equal to or less than the solder ball formation distance $D_2$ (S201—YES), the circuit board design device judges whether the via hole is electrically connected to the non-coated via hole 20 in parallel (S202). When the circuit board design device judges that the via hole the distance from which to the metal member 31 is equal to or less than the solder ball formation distance $D_2$ is electrically connected to the non-coated via hole 20 in parallel (S202—YES), the circuit board design device determines the via hole as the coated via hole 41 (S203).

When the circuit board design device judges that the via hole the distance from which to the metal member 31 is equal to or less than the solder ball formation distance $D_2$ is not electrically connected to the non-coated via hole 20 in parallel (S202—NO), the circuit board design device reviews the arrangement of the via hole (S204). In one example, the circuit board design device arranges the via hole, which has been judged to be not connected to the non-coated via hole 20 in parallel, apart from the metal member 31 by a distance larger than the solder ball formation distance $D_2$.

(Printed Circuit Board Structure According to the Third Embodiment)

Figure 7:
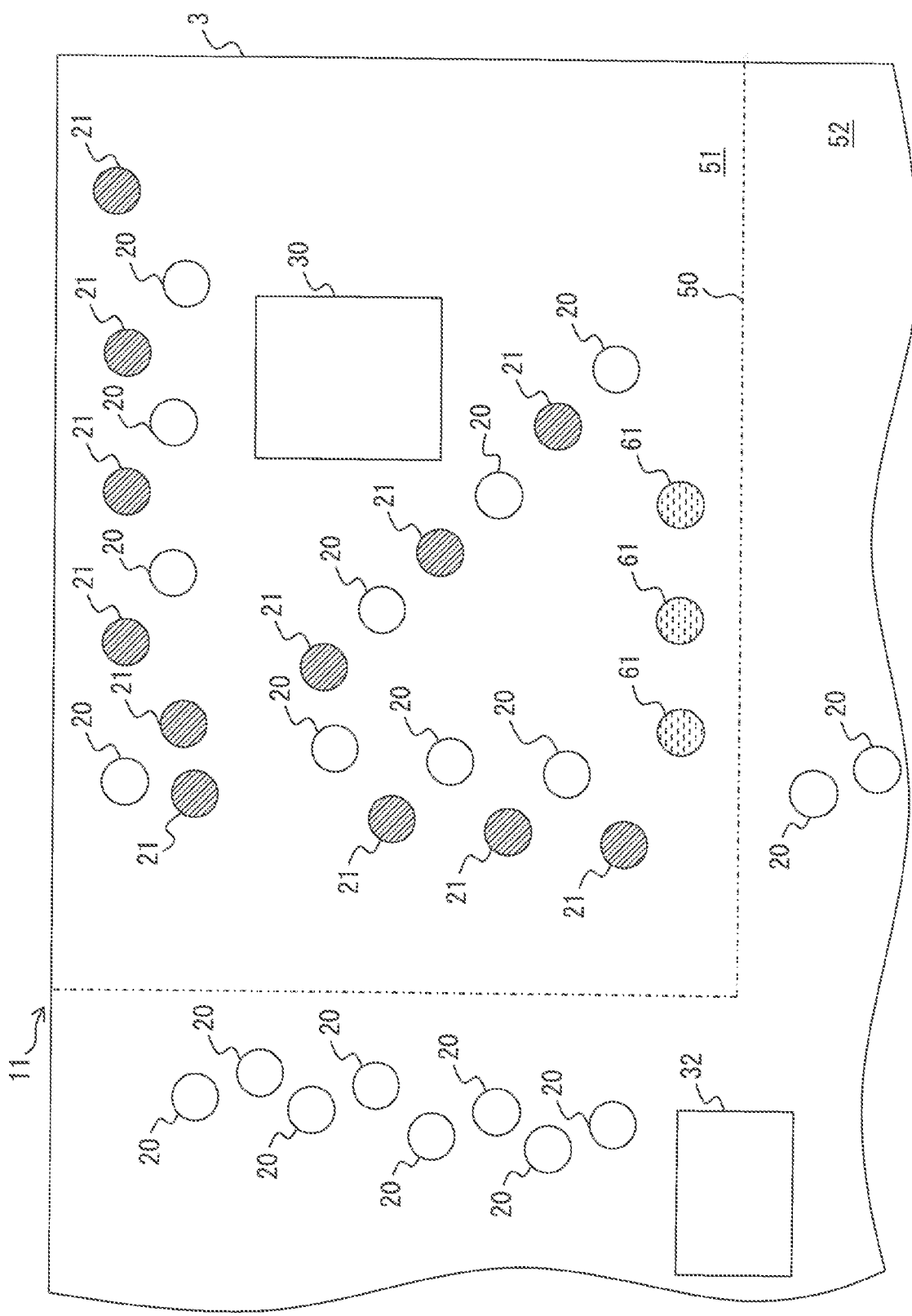
FIG. 7 is a partial plan view of a printed circuit board according to a third embodiment.

FIG. 7 is a partial plan view of a printed circuit board according to the third embodiment.

A printed circuit board 3 differs from the printed circuit board 1 in that the printed circuit board 3 includes a first region 51 in which an electronic component is soldered by the flow process or the dip process and a second region 52 in which an electronic component is soldered by a reflow process. The reflow process indicates a soldering process in which solder paste is printed on a printed circuit board and is heated with an electronic component being arranged on the printed solder paste. A boundary 50 to be descried below is present between the first region 51 and the second region 52. Preferably, a line indicating the boundary 50 is printed by silkscreen printing or the like. The printed circuit board 3 differs from the printed circuit board 1 in that an electronic component 32 is arranged in addition to the electronic component 30. In addition, the printed circuit board 3 differs from the printed circuit board 1 in that via holes 61 are formed in addition to the via holes 20-21. Constituent elements of the printed circuit board 3 other than the electronic component 32 and the via holes 61 are the same as the constituent elements of the printed circuit board 1, which are designated with the same reference numerals, and their detailed descriptions are omitted.

The electronic component 32 is soldered by the reflow process and is arranged in the second region 52. Then, the electronic component 30 is soldered by the flow process or the dip process and is arranged in the first region 51. The reflow process is suitable for soldering a small-sized component, and the flow process or the dip process is suitable for soldering a large-sized component. Using such techniques enables adoption of a suitable soldering method when a small-sized component and a large-sized component are arranged together on one printed circuit board. Furthermore, when the electronic component 30 is soldered by the flow process or the dip process and is arranged in the first region 51, the second region 52 is protected by being covered with a metallic masking jig so that the electronic component 32, which is preliminarily soldered by the reflow process and is arranged in the second region 52, is not removed by being washed by the solder in the flow process or the dip process. In this case, the boundary 50 is a line indicating a range where the metallic masking jig contacts the printed circuit board 3.

Figure 8:
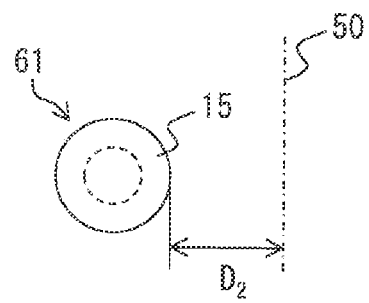
FIG. 8 is a view for explaining a distance between a non-coated via hole and a coated via hole illustrated in FIG. 7.

FIG. 8 is a view for explaining a distance between the boundary 50 and the coated via hole 61.

Regarding the printed circuit board 3, a distance between the boundary 50 and the coated via hole 61 is equal to or less than the solder ball formation distance $D_2$ where the solder for soldering the electronic component 30 forms the solder ball 19. In other words, when a distance between the boundary 50 and the coated via hole 61 is equal to or less than the solder ball formation distance $D_2$, the via hole is selected as the coated via hole 61. In one example, when a distance with the boundary 50 is 1.5 mm or less, the via hole is selected as the coated via hole 61. As described above, the boundary 50 indicates a range where the metallic masking jig contacts the printed circuit board 3 when the electronic component, e.g., the electronic component 30, arranged in the first region 51 is soldered by the flow process or the dip process. Because the metallic masking jig has a large heat capacity, there is a possibility that, when the electronic component 30 or the like is soldered by the flow process or the dip process, the temperature of the land of the via hole the distance from which to the boundary 50 is equal to or less than the solder ball formation distance $D_2$ is not sufficiently increased, so that the solder is not well spread on the land and the solder ball is formed on the land. When the solder resist is applied over a via hole the distance from which to the boundary 50 is equal or less than the solder ball formation distance $D_2$, the solder ball can be prevented from being formed on the land of the via hole lying within the solder ball formation distance $D_2$.

Furthermore, as with the first embodiment, the coated via hole 61 is electrically connected to any of the non-coated via holes 20 in parallel, even if the via hole is disconnected by an etching solvent or the like remaining in the through-hole of the coated via hole 61, the non-coated via hole 20 connected in parallel maintains the electrical connection, thereby reducing the possibility of malfunction of the electronic equipment, and more preferably, the non-coated via hole 20 and the coated via hole 61 are provided on a pattern unit constituting the power supply feed line VDD of the printed circuit board and on a pattern unit constituting the ground line VSS of the printed circuit board.

Figure 9:
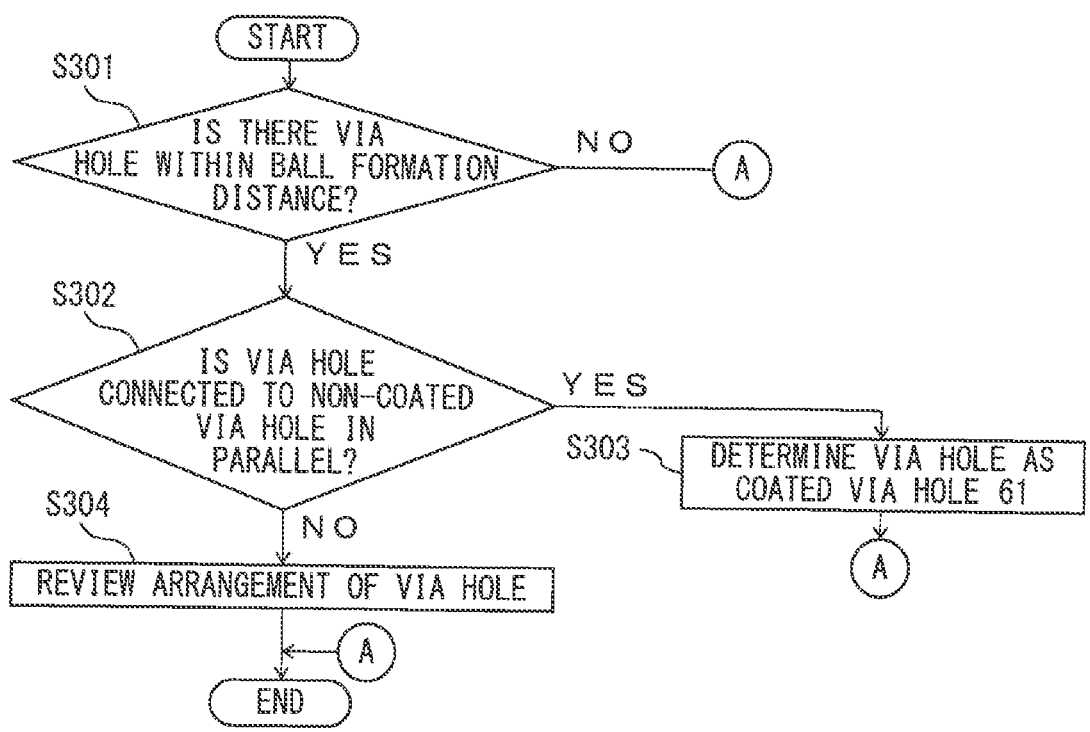
FIG. 9 is a flow chart indicating coated via hole determination processing for determining the coated via hole illustrated in FIG. 7.

FIG. 9 is a flow chart indicating coated via hole determination processing for determining the coated via hole 61. The processing illustrated in FIG. 9 is executed on each via hole formed on a printed circuit board by a circuit board design device, which is not illustrated. In addition, the processing of FIG. 9 may be performed continuously to the processing illustrated in FIG. 3 or FIG. 6 by the circuit board design device of the first embodiment or the second embodiment.

First, the circuit board design device judges whether there is a via hole the distance from which to the boundary 50 is equal to or less than the solder ball formation distance $D_2$ where the solder ball can be formed when the soldering is performed with the solder by the flow process or the dip process (S301). When the circuit board design device judges that there is no via hole the distance from which to the boundary 50 is equal to or less than the solder ball formation distance $D_2$ (S301—NO), the processing is completed.

When the circuit board design device judges that there is a via hole the distance from which to the boundary 50 is equal to or less than the solder ball formation distance $D_2$ (S301—YES), the circuit board design device judges whether the via hole is electrically connected to the non-coated via hole 20 in parallel (S302). When the circuit board design device judges that the via hole the distance from which to the boundary 50 is equal to or less than the solder ball formation distance $D_2$ is electrically connected to the non-coated via hole 20 in parallel (S302—YES), the circuit board design device determines the via hole as the coated via hole 61 (S303).

When the circuit board design device judges that the via hole the distance from which to the boundary 50 is equal to or less than the solder ball formation distance $D_2$ is not electrically connected to the non-coated via hole 20 in parallel (S302—NO), the circuit board design device reviews the arrangement of the via hole (S303). In one example, the circuit board design device arranges the via hole, which has been judged to be not connected to the non-coated via hole 20 in parallel, apart from the boundary 50 by a distance larger than the ball formation distance $D_2$.

In the description above, the electronic component 32 arranged in the second region 52 is soldered by the reflow process. However, the method of arranging the electronic component 32 to be arranged in the second region 52 is not limited thereto, but other soldering methods (the flow method and the dip method) or other joining methods (bonding with electrically conductive paste or the like) may be used. In short, the printed circuit board structure of the present embodiments may be adopted insofar as a technique of protecting the second region 52 with a masking jig is adopted so that the solder does not enter the second region 52 where the electronic component 32 is already arranged when the soldering is performed in the first region 51 by the flow process or the dip process.

Figure 10A:
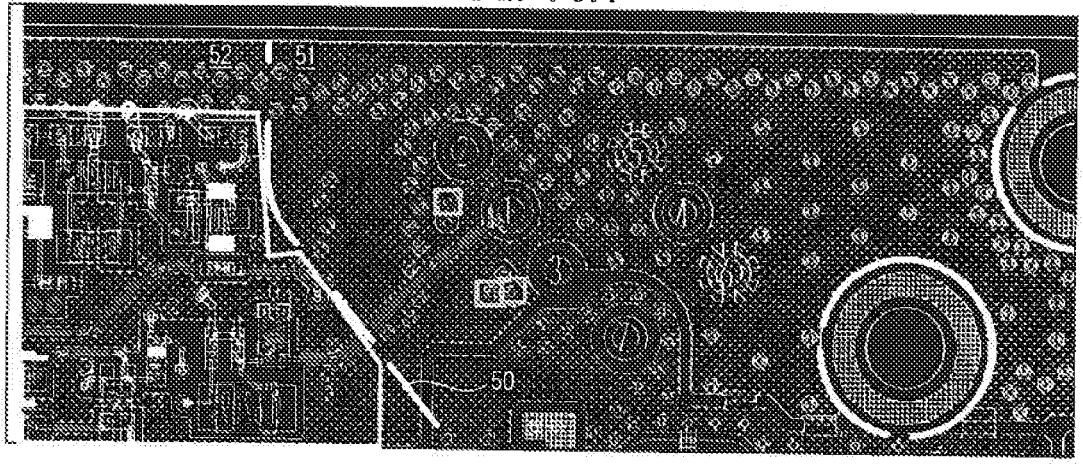
FIG. 10A is views illustrating an arrangement example of coated via holes in which arrangement example, the distance with respect to adjacent non-coated via holes is equal to or less than a solder bridge formation distance.
Figure 10B:
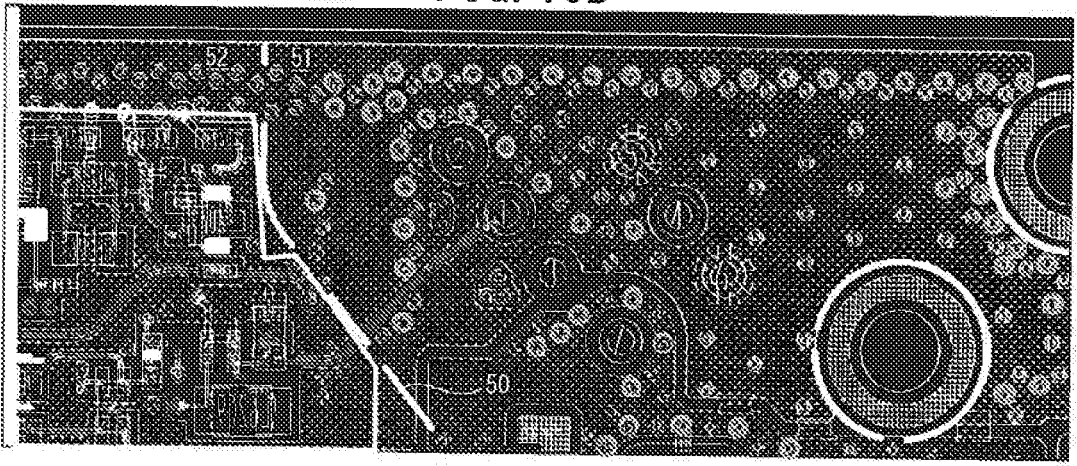
FIG. 10B is views illustrating an arrangement example of coated via holes in which arrangement example, the distance with respect to adjacent non-coated via holes is equal to or less than a solder bridge formation distance.
Figure 10C:
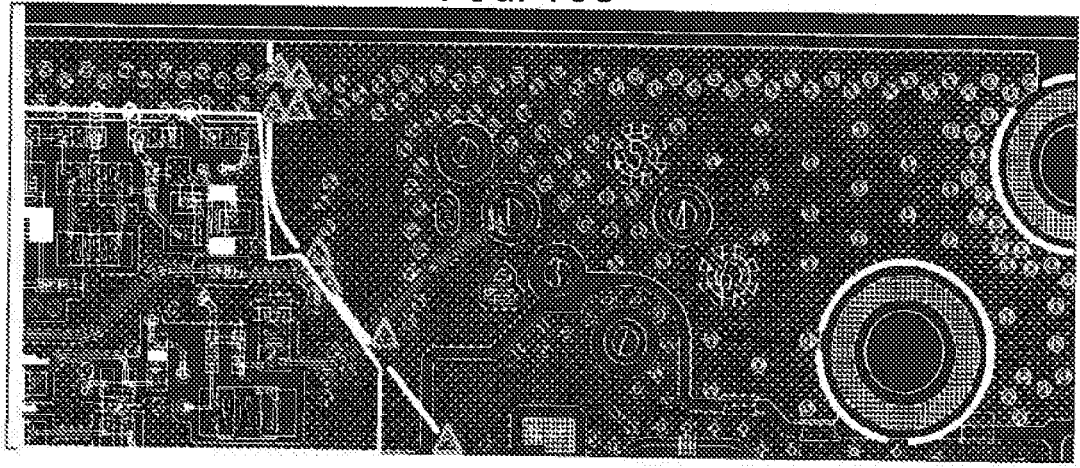
FIG. 10C is a view illustrating an arrangement example of coated via holes in which arrangement example the distance with respect to a boundary is equal to or less than a solder ball formation distance.

FIG. 10 is a view illustrating an example of the printed circuit board described in the first embodiment to the third embodiment. FIG. 10A is a first view illustrating an arrangement example of the coated via holes 21, FIG. 10B is a second view illustrating an arrangement example of the coated via holes 21, and FIG. 10C is a view illustrating an arrangement example of the coated via holes 61. In FIG. 10A, the coated via holes 21 are indicated by square marks, in FIG. 10B, the coated via holes 21 are indicated by circular marks, and in FIG. 10C, the coated via holes 61 are indicated by triangular marks.

In the example illustrated in FIG. 10, the printed circuit board is a glass epoxy substrate, which is also called an FR-4 (Flame Retardant Type 4). The printed circuit board has a thickness of 1.6 mm, and the via holes formed on the printed circuit board have a diameter of 0.3 mm. The solder for soldering the electronic component by the flow process or the dip process is Sn-3.0% Ag-0.5% Cu (tin 96.5%, silver 3%, copper 0.5% (lead free).

The temperature of the solder in the solder bath used when the soldering is performed in the first region 51 by the flow process or the dip process is 320° C.±5° C. Soldering time for soldering by the flow process or the dip process is about six seconds or less although temperature increase time, fillet formation time and the like vary with conditions such as the size and the shape of an electronic component, and the size, the material and the shape of a terminal.

The coated via holes 21 illustrated by square marks in FIG. 10A are via holes the distance from which to adjacent non-coated via holes 20 is 0.75 mm or less and which are connected to the power supply feed line VDD. The coated via holes 21 illustrated by circular marks in FIG. 10B are via holes the distance from which to adjacent non-coated via holes 20 is 0.75 mm or less and which are connected to the ground line VSS. The coated via holes 61 indicated by triangular marks in FIG. 10C are via holes the distance from which to the boundary 50 is 1.5 mm or less and which are connected to the ground line VSS.

The distance between the coated via hole 21 and the non-coated via hole 20, and the distance between the boundary 50 and the coated via hole 61 were determined based on an experiment in which the soldering time was changed with respect to various types of components. The minimum value of the soldering time is minimum time that can ensure the connection strength of the solder, and the upper limit value of the soldering time is six seconds.

(Technical Effect of the Printed Circuit Board Structure According to the Embodiments)

Regarding the printed circuit board structure according to the embodiments, the solder resist is applied over a via hole the distance from which to an adjacent via hole is equal to or less than the solder bridge formation distance where the solder bridge is formed and on which the soldering is not performed. Regarding the printed circuit board structure according to the embodiments, because the solder resist is applied over a via hole the distance from which to an adjacent via hole is equal to or less than the solder bridge formation distance and on which the soldering is not performed, the formation of the solder bridge can be prevented during the soldering by the flow process or the dip process.

Figure 11B:
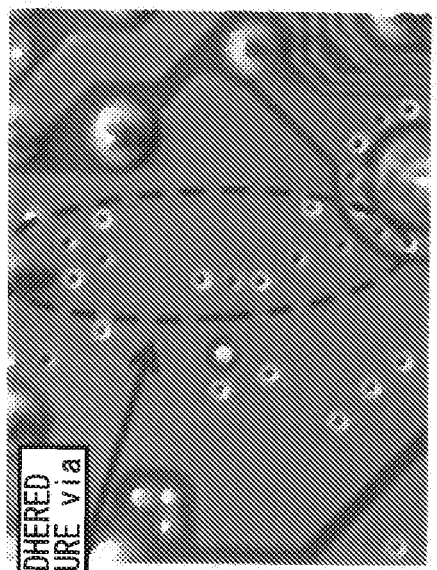
FIG. 11B is a view illustrating an example of a state of solder adhered to a via hole of the printed circuit board according to the present embodiments.
Figure 11A:
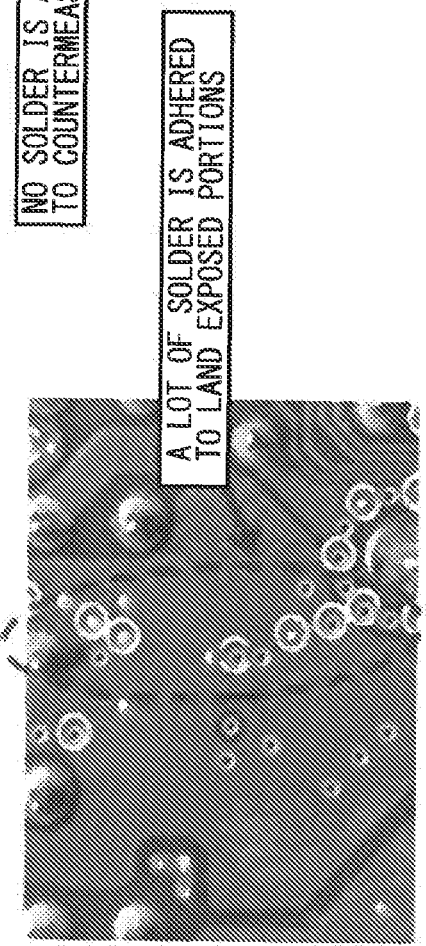
FIG. 11A is a view illustrating an example of a state of solder adhered to a via hole in a mounting structure according to a comparative example.

FIG. 11A is a view illustrating an example of a state where the solder is adhered to a via hole in a mounting structure according to a comparative example, and FIG. 11B is a view illustrating an example of a state where the solder is adhered to a via hole in a printed circuit board according to the present embodiment. In the example illustrated in FIG. 11A, the solder resist is not applied over the via hole on which the soldering is not performed, and in the example illustrated in FIG. 11B, as in the case of the printed circuit boards 1 to 3, the non-coated via hole and the coated via hole are arranged.

In the example illustrated in FIG. 11A, because the solder is adhered to a land exposed portion during the soldering by the flow process or the dip process, the solder bridge or the solder ball can be formed. In contrast, in the example illustrated in FIG. 11B, because unnecessary solder is not adhered during the soldering by the flow process or the dip process, there is no possibility that the solder bridge or the solder ball is formed.

In addition, regarding the printed circuit board structure according to the embodiments, the solder resist is applied over a via hole the distance from which to a metal member is equal to or less than the solder ball formation distance where the solder ball is formed and on which the soldering is not performed. Regarding the printed circuit board structure according to the embodiments, because the solder resist is applied over a via hole the distance from which to a metal member is equal to or less than the solder ball formation distance and on which the soldering is not performed, the formation of the solder ball on the land of the via hole can be prevented during the soldering by the flow process or the dip process.

In addition, regarding the printed circuit board structure according to the embodiments, the solder resist is applied over a via hole the distance of which with respect to the boundary with respect to the region where the soldering is performed by the reflow process and on which the soldering is not performed. In addition, in the printed circuit board structure according to the embodiments, the solder resist is applied to a via hole the distance from which to the boundary with the region where the soldering is performed by the reflow process is equal to or less than the solder ball formation distance where the solder ball is formed and on which the soldering is not performed. Regarding the printed circuit board structure according to the embodiments, because the solder resist is applied over a via hole the distance from which to the boundary is equal to or less than the solder ball formation distance and on which the soldering is not performed, the formation of the solder ball due to influences of a masking jig can be prevented during the soldering by the flow process or the dip process.

In addition, regarding the printed circuit board structure according to the embodiments, the coated via hole, which is coated with the solder resist, is electrically connected to any of the non-coated via holes, which are not coated with the solder resist, in parallel. Regarding the printed circuit board structure according to the embodiments, because the coated via hole is connected to the non-coated via hole, even when the disconnection occurs in the coated via hole, because an electric signal is transmitted and received via the non-coated via hole, there is no possibility that the function of the printed circuit board is lost.

In addition, regarding the printed circuit board structure according to the embodiments, because any of the coated via holes is connected to the power supply voltage line connected to the non-coated via hole, even when the disconnection occurs in the coated via hole, a power supply voltage can be fed via the non-coated via hole.

In addition, regarding the printed circuit board structure according to the embodiments, because any of the coated via holes is connected to the ground line connected to the non-coated via hole, even when the disconnection occurs in the coated via hole, grounding can be made via the non-coated via hole.

The via holes 20 and 41 are arranged on the printed circuit board 2, and the via holes 20 and 61 are arranged on the printed circuit board 3. However, the via holes 41 and 61 may be arranged on the printed circuit board according to the embodiments.

What is claimed is:

1. A method for designing a circuit board comprising, judging, by a circuit board design device, whether or not the circuit board has a pair of via holes which are adjacent within a solder bridge formation distance within which a solder bridge can be formed;
when the circuit board design device judges that the circuit board has the pair of via holes, the circuit board design device judging whether or not that each of the pair of via holes is electrically connected in parallel to other via hole with a land not coated with solder resist;
when the circuit board design device judges that at least one of the pair of via holes is electrically connected in parallel to the other via hole with a land not coated with solder resist, the circuit board design device determining the at least one of the pair of via holes which is electrically connected in parallel to the other via hole with a land not coated with solder resist as a coated via hole with a land coated with solder resist.

2. The method for designing a circuit board according to claim 1, when the circuit board design device judges that none of the pair of via holes is electrically connected in parallel to the other via hole with a land not coated with solder resist, further comprising the circuit board design device rearranging the position of at least one of the pair of via holes in the circuit board so that the distance between the pair of the via holes is larger than the solder bridge formation distance.

3. A method for designing a circuit board comprising, judging, by a circuit board design device, whether or not the circuit board has a first via hole which is positioned equal to or less than the solder ball formation distance, within which a solder ball can be formed, from a metal member which is soldered on the circuit board;
when the circuit board design device judges that the circuit board has the first via hole, the circuit board design device judging whether or not that the first via hole is electrically connected in parallel to a second via hole with a land not coated with solder resist; and
when the first via hole is electrically connected in parallel to the second via hole, the circuit board design device determining the first via hole as a coated via hole with a land coated with solder resist.

4. The method for designing a circuit board according to claim 3, when the first via hole is not electrically connected in parallel to the second via hole, further comprising the circuit board design device rearranging the position of the first via hole in the circuit board so that the distance between the first via hole and the second via hole is larger than the solder ball formation distance.

5. A method for designing a circuit board which has a first region in which an electronic component is soldered by a flow process or a dip process and a second region protected from solder by a masking jig when soldering is performed in the first region, the method comprising,
judging, by a circuit board design device, whether or not the circuit board has a first via hole which is positioned equal to or less than the solder ball formation distance, within which a solder ball can be formed, from a boundary between the first region and the second region;
when the circuit board design device judges that the circuit board has the first via hole, the circuit board design device judging whether or not that the first via hole is electrically connected in parallel to a second via hole with a land not coated with solder resist; and
when the first via hole is electrically connected in parallel to the second via hole, the circuit board design device determining the first via hole as a coated via hole with a land coated with solder resist.

6. The method for designing a circuit board according to claim 5, when the first via hole is not electrically connected in parallel to the second via hole, further comprising the circuit board design device rearranging the position of the first via hole in the circuit board so that the distance between the first via hole and the second via hole is larger than the solder ball formation distance.

* * * * *